United States Patent
Schuerz

(10) Patent No.: US 9,945,337 B2
(45) Date of Patent: Apr. 17, 2018

(54) PIEZOELECTRIC INJECTOR FOR DIRECT FUEL INJECTION

(71) Applicant: Continental Automotive GmbH, Hannover (DE)

(72) Inventor: Willibald Schuerz, Pielenhofen (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 18 days.

(21) Appl. No.: 15/024,521

(22) PCT Filed: Sep. 19, 2014

(86) PCT No.: PCT/EP2014/069999
§ 371 (c)(1),
(2) Date: Mar. 24, 2016

(87) PCT Pub. No.: WO2015/044048
PCT Pub. Date: Apr. 2, 2015

(65) Prior Publication Data
US 2016/0245247 A1     Aug. 25, 2016

(30) Foreign Application Priority Data
Sep. 25, 2013 (DE) .......... 10 2013 219 225

(51) Int. Cl.
*F02M 63/00* (2006.01)
*F02M 51/06* (2006.01)
(Continued)

(52) U.S. Cl.
CPC ........ *F02M 51/0603* (2013.01); *F02M 61/08* (2013.01); *F02M 61/14* (2013.01);
(Continued)

(58) Field of Classification Search
CPC ........... F02M 51/0603; F02M 51/0653; F02M 63/059; F02M 63/0066; F02M 63/0057; H01L 41/08
See application file for complete search history.

(56) References Cited

U.S. PATENT DOCUMENTS 4,725,002 A * 2/1988 Trachte .............. F02M 51/0603
239/102.2
4,803,393 A * 2/1989 Takahashi .............. F02M 47/02
123/478
(Continued)

FOREIGN PATENT DOCUMENTS

| CN | 101560934 A | 10/2009 | |
| CN | 102720692 A | 10/2012 | ............. F04D 27/00 |

(Continued)

OTHER PUBLICATIONS

German Office Action, Application No. 102013220087.0, 4 pages, dated May 30, 2014.
(Continued)

*Primary Examiner* — Thomas Moulis
(74) *Attorney, Agent, or Firm* — Slayden Grubert Beard PLLC

(57) ABSTRACT

A piezo injector for direct fuel injection may comprise an injector body, an actuator unit having a piezoelectric actuator with a head plate and a base plate, a hydraulic coupler having a coupler piston, a coupler cylinder, and a coupler spring, and a nozzle unit having a nozzle needle arranged in a nozzle body. The piezoelectric actuator is surrounded by a corrugated tube braced between the head plate and the base plate such that the piezoelectric actuator has a preload imparted to it. The coupler spring forces the coupler piston against a face side, facing toward the coupler piston, of the nozzle needle.

18 Claims, 2 Drawing Sheets

(51) Int. Cl.
*F02M 61/08* (2006.01)
*H01L 41/053* (2006.01)
*F02M 61/14* (2006.01)
*F02M 61/16* (2006.01)

(52) U.S. Cl.
CPC ..... *F02M 63/0057* (2013.01); *H01L 41/0536* (2013.01); *F02M 61/167* (2013.01); *F02M 2200/26* (2013.01); *F02M 2200/708* (2013.01); *F02M 2200/9053* (2013.01)

(56) References Cited

U.S. PATENT DOCUMENTS

| | | | | |
|---|---|---|---|---|
| 5,931,390 | A * | 8/1999 | Hoffmann | F02M 51/0603 239/562 |
| 6,585,171 | B1 | 7/2003 | Boecking | 239/102.1 |
| 6,661,159 | B2 | 12/2003 | Yamada | 310/328 |
| 7,309,032 | B2 | 12/2007 | Fischer et al. | 239/585.1 |
| 7,665,445 | B2 | 2/2010 | Krishnapura et al. | 123/498 |
| 7,886,993 | B2 * | 2/2011 | Bachmaier | F02M 51/0603 239/102.1 |
| 7,898,152 | B2 | 3/2011 | Stocker et al. | 310/328 |
| 9,567,932 | B2 * | 2/2017 | Bartsch | F02D 41/20 |
| 2003/0127617 | A1 * | 7/2003 | Kegel | F02M 51/0603 251/129.06 |
| 2004/0011892 | A1 * | 1/2004 | Hohl | F02M 51/0603 239/533.2 |
| 2004/0031862 | A1 * | 2/2004 | Eichendorf | F02M 51/0603 239/102.2 |
| 2004/0079815 | A1 * | 4/2004 | Hohl | F02M 51/0603 239/102.2 |
| 2004/0154562 | A1 * | 8/2004 | Mattes | F02M 47/027 123/90.11 |
| 2005/0205686 | A1 * | 9/2005 | Yildirim | F02M 51/0603 239/102.2 |
| 2005/0247803 | A1 * | 11/2005 | Liskow | F02M 51/005 239/102.2 |
| 2006/0043213 | A1 * | 3/2006 | Gerschwitz | F02M 51/0603 239/102.2 |
| 2006/0169802 | A1 * | 8/2006 | Pauer | F02M 51/0603 239/533.2 |
| 2006/0175438 | A1 * | 8/2006 | Stier | F02M 51/005 239/584 |
| 2006/0196975 | A1 * | 9/2006 | Magel | F02M 51/0603 239/533.2 |
| 2006/0208107 | A1 * | 9/2006 | Heinz | F02M 45/083 239/533.2 |
| 2007/0001027 | A1 * | 1/2007 | Stier | F02M 51/0603 239/102.2 |
| 2007/0023542 | A1 * | 2/2007 | Stoecklein | F02M 51/0603 239/88 |
| 2007/0096375 | A1 * | 5/2007 | Stier | F02M 51/0603 267/167 |
| 2007/0113536 | A1 | 5/2007 | Dick et al. | 60/211 |
| 2007/0131202 | A1 * | 6/2007 | Wolff | F02F 1/242 123/469 |
| 2008/0099583 | A1 * | 5/2008 | Magel | F02M 51/0603 239/533.3 |
| 2009/0308956 | A1 * | 12/2009 | Magel | F02M 47/027 239/584 |
| 2010/0102147 | A1 * | 4/2010 | Uhlmann et al. | F02M 47/027 239/589 |
| 2010/0313853 | A1 * | 12/2010 | Morris | F02M 51/0603 123/472 |
| 2011/0000465 | A1 * | 1/2011 | Stoecklein | F02D 41/2096 123/478 |
| 2012/0048239 | A1 * | 3/2012 | Jalal | F02D 41/2096 123/472 |
| 2012/0325935 | A1 * | 12/2012 | Wuerfel | F02M 51/0603 239/533.2 |
| 2013/0056563 | A1 * | 3/2013 | Schmieder | F02M 51/0603 239/585.1 |
| 2015/0063989 | A1 | 3/2015 | Wang et al. | 415/157 |
| 2015/0167571 | A1 * | 6/2015 | Bartsch | F02D 41/20 137/1 |
| 2015/0211456 | A1 * | 7/2015 | Schuerz | F02M 51/0603 123/472 |
| 2015/0252761 | A1 * | 9/2015 | Graves | F02M 51/0603 239/5 |

FOREIGN PATENT DOCUMENTS

| | | | |
|---|---|---|---|
| DE | 2813736 A1 | 10/1978 | |
| DE | 4210048 A1 | 9/1993 | |
| DE | 19514707 A1 | 10/1996 | |
| DE | 19843570 A1 | 3/2000 | |
| DE | 10048430 A1 | 4/2002 | |
| DE | 10232383 A1 | 2/2003 | |
| DE | 10145620 A1 | 4/2003 | |
| DE | 102005063010 A1 | 7/2007 | |
| DE | 102006043027 A1 | 3/2008 | |
| DE | 102008046220 A1 | 3/2010 | |
| DE | 102010026176 A1 | 1/2012 | ............ F04D 29/46 |
| EP | 1420146 A1 | 5/2004 | |
| EP | 2317117 A1 | 5/2011 | ............ F02M 51/06 |
| JP | 2010003980 A | 1/2010 | |
| WO | 03/089781 A1 | 10/2003 | |
| WO | 2013/166626 A1 | 11/2013 | ............ F02D 27/00 |
| WO | 2015/044048 A1 | 4/2015 | ............ F02M 51/06 |

OTHER PUBLICATIONS

International Search Report and Written Opinion, Application No. PCT/EP2014/069999, 28 pages, dated Nov. 4. 2014.
International Search Report and Written Opinion, Application No. PCT/EP2014/070499, 24 pages, dated Jan. 16, 2015.
German Office Action, Application No. 102013219225.8, 5 pages, dated Dec. 21, 2015.
Chinese Office Action, Application No. 201480053158.3, 12 pages.

* cited by examiner

PIEZOELECTRIC INJECTOR FOR DIRECT FUEL INJECTION

CROSS-REFERENCE TO RELATED APPLICATIONS

This application is a U.S. National Stage application of International Application No. PCT/EP2014/069999 filed Sep. 19, 2014, which designates the United States of America, and claims priority to DE Application No. 10 2013 219 225.8 filed Sep. 25, 2013, the contents of which are hereby incorporated by reference in their entirety.

TECHNICAL FIELD

The disclosure relates to fuel injectors and, in some embodiments includes a piezo injector for direct fuel injection.

BACKGROUND

For direct fuel injection in internal combustion engines, typical injectors include a piezo drive or a solenoid drive. Solenoid injectors are formed predominantly as multi-hole injectors with an inwardly opening nozzle needle, whereas piezo injectors often have a conical jet and an outwardly opening nozzle needle.

Piezo injectors are generally of highly complex construction because a stable injection function is demanded in a pressure range from for example 5 bar to 200 bar. To meet this demand, a so-called pressure-balanced nozzle needle may be employed. This leads to an increase in costs. A major advantage of piezo injectors with an outwardly opening nozzle needle consists in the mixture preparation quality. This makes it possible, even in the case of a considerably lowered injection pressure such as for example 100 bar, for legal requirements with regard to admissible particle count to be satisfied in a stable manner throughout the service life.

In relation to piezo injectors, solenoid injectors are of simpler and less expensive construction. In particular, no idle travel compensation is necessary. Furthermore, solenoid injectors do not have pressure-balanced nozzle needles. Owing to the inwardly opening movement direction, in the case of which a very small needle seat diameter of for example 1.4 mm can be realized, this is not as disadvantageous as in the case of injectors with outwardly opening nozzle needles, which typically have seat diameters of approximately 3.6 mm to 4 mm. However, in the case of high injection pressures of, for example, 350 bar to 500 bar, increasing difficulties are encountered even in the case of solenoid injectors. A particular challenge in the case of solenoid injectors with multi-hole nozzles is that of satisfying legal requirements with regard to particle count throughout the entire service life. Various test results have shown that a pressure increase from 200 bar to 350 to 500 bar reduces the particle count significantly and in a stable manner throughout the service life. On the other hand, the costs of the injection system are however thus also greatly increased.

SUMMARY OF THE INVENTION

The present disclosure may provide an improved injector for direct fuel injection, distinguished by a high level of robustness and is relatively simple and inexpensive to produce.

In at least one embodiment, the piezo injector comprises an injector body. The injector body at least regionally forms the housing of the piezo injector and may be in the form of a hollow cylinder, composed in particular of steel.

Furthermore, the piezo injector comprises an actuator unit which has a piezoelectric actuator. The piezoelectric actuator may in particular have a piezo stack. The piezoelectric actuator has a head plate and a base plate. The piezoelectric actuator is surrounded by a corrugated tube which is braced between the head plate and the base plate so as to impart a preload to the piezoelectric actuator. The head plate and the base plate of the piezoelectric actuator may be welded to opposite ends of the corrugated tube.

In some embodiments, the piezoelectric actuator may be encapsulated by the corrugated tube. The piezoelectric actuator may be arranged in the interior of the corrugated tube, wherein one end of the corrugated tube is fixedly welded to the head plate and the other end is fixedly welded to the base plate. In this way, the piezoelectric actuator may be hermetically sealed with respect to fuel.

Furthermore, in some embodiments, the piezo injector comprises a hydraulic coupler which has a coupler piston, a coupler cylinder and a coupler spring.

Furthermore, in some embodiments, the piezo injector comprises a nozzle unit which has a nozzle needle arranged in a nozzle body. By way of a coupler spring, the coupler piston may be forced against a face side, facing toward the coupler piston, of the nozzle needle. In this way, clearance-free transmission of force from the piezoelectric actuator via the hydraulic coupler to the nozzle needle is ensured.

The corrugated tube of the actuator unit may be formed from a so-called maraging steel. The expression "maraging" is a combination of the words "martensite" and "aging", and is generally used for martensitically hardenable steel. The corrugated tube may for example be produced from a hollow cylindrical part composed of a maraging steel. Here, the hollow cylindrical part is heated to a predefined first temperature at which the maraging steel is in an austenitic state. In an advantageous refinement, the first temperature lies in a range between 700 and 950° C. In said temperature range, the plastic deformability is very high, for example greater than 30%. The corrugated tube is subsequently cooled, such that the maraging steel is in a martensitic state. As a result of the cooling of the corrugated tube, such that the maraging steel is in the martensitic state, or at least predominantly in the martensitic state, it is possible to realize a very high strength.

In some embodiments, after the deformation process, the corrugated tube is initially cooled until a predefined condition is satisfied. The predefined condition may be satisfied for example when a predefined second temperature is approximately reached, which second temperature may for example correspond approximately to room temperature. Subsequently, the corrugated tube is heated again and is aged in a predefined temperature range for a predefined time duration. The time duration may for example lie in a range from two to four hours. The predefined temperature range for the aging particularly advantageously lies between 400° C. and 500° C., in particular between 450° C. and 480° C. After the initial cooling to the second temperature, which in particular corresponds approximately to room temperature, the lattice structure of the maraging steel is predominantly converted into the martensitic state. As a result of the aging, also referred to as age-hardening, the martensite formation is completed, and it is possible to realize a particularly high strength, which may for example assume values ≥2000 MPa.

In some embodiments, the head plate of the actuator unit comprises a supply line for fuel, through which supply line fuel is supplied at high pressure to the piezo injector. Furthermore, the head plate may comprise a feed of electrical connections from an electrical plug connector to the piezoelectric actuator.

In some embodiments, the coupler cylinder of the hydraulic coupler unit is formed in the base plate of the piezoelectric actuator. In this way, the piezoelectric actuator may be connected directly to the hydraulic coupler. The coupler piston, which may be comprised of hollow-bored form in order to reduce the moving masses, is inserted into the coupler cylinder with a suitable fit clearance. To achieve suitable dynamic transmission characteristics of the coupler, the fit clearance is preferably between 2 µm and 6 µm.

The piezo injector may not comprise any sealing material composed of a plastic. Plastics-based seals, composed in particular of elastomers, are conventionally used in conventional piezo injectors to seal off the piezoelectric actuator. Such plastics-based seals are not necessary in the piezo injector described here, because the piezoelectric actuator is, by way of the corrugated tube and the head plate and base plate fixedly connected to the corrugated tube, sealed off exclusively by way of metallic parts. The piezoelectric actuator is therefore sealed off in particularly robust fashion with respect to highly pressurized fuel.

In some embodiments, the injector body is a unipartite tube piece which is fixedly connected, in particular welded, at one side to the head plate and at an opposite side to the nozzle body.

In some embodiments, the nozzle needle of the nozzle unit is designed as an outwardly opening nozzle needle. The needle seat of the nozzle needle may take the form of a conical shell surface which, in the nozzle body, is forced against a hollow conical surface, with the sealing function thus being realized.

To generate a closing force which acts on the nozzle needle, the nozzle unit may include a nozzle spring. The nozzle spring, at one side, may be fastened to the nozzle body and, at another side, press against a spring plate which is attached to the nozzle needle, in particular pressed onto the nozzle needle. In this way, the sealing force generated by the nozzle spring is transmitted to the nozzle needle.

In some embodiments, a fuel film, in particular a very thin fuel film, is arranged in the hydraulic coupler. The fuel film may be situated between a face side of the coupler piston and a face side, facing toward the coupler piston, of the base plate of the actuator unit in which the coupler cylinder is formed. The thickness of said thin fuel layer may be selected to be as small as possible such that the hydraulic coupler has the greatest possible stiffness. The minimum thickness of the layer is determined by the required assembly tolerances and the differences in change in length between the piezoelectric actuator and the injector body in the event of temperature changes owing to the different coefficients of thermal expansion between the piezoelectric actuator and the material of the injector body, in particular steel. The layer thickness of the thin fuel layer may lie in the range from 0.05 mm to 0.3 mm.

In some embodiments, the injector body may be composed of a tube piece which is of unipartite form and which is welded, at a top side, to the head plate of the piezoelectric actuator and, at a bottom side, to the nozzle body. During the course of the process of assembly of the injector body, the layer thickness of the fuel layer in the hydraulic coupler can be set.

The piezo injector described herein may be characterized in particular by the fact that changes in length owing to temperature effects, owing to wear at contact points and/or owing to a change in the state of polarization of the piezoelectric actuator can be compensated. The piezoelectric actuator may have no idle travel, whereby the actuation energy is reduced and cumbersome adjustment processes for the idle travel during the assembly of the piezo injector can be eliminated.

The piezo injector may be furthermore characterized by a very simple assembly process, whereby the manufacturing costs are reduced. In the case of the described piezo injector, the injection quantity during dynamic engine operation may be highly stable. Through the use of exclusively metallic seals, pressure losses in the injector are minimized, and the piezoelectric actuator is sealed off in a particularly reliable manner with respect to fuel.

BRIEF DESCRIPTION OF THE DRAWINGS

Further embodiments and advantages of the piezo injector will emerge from the following description of an exemplary embodiment and on the basis of FIGS. 1 to 3.

In the Figures.

DETAILED DESCRIPTION

The illustrated components and the proportions of the components relative to one another are not to be regarded as being true to scale.

Figure 1:
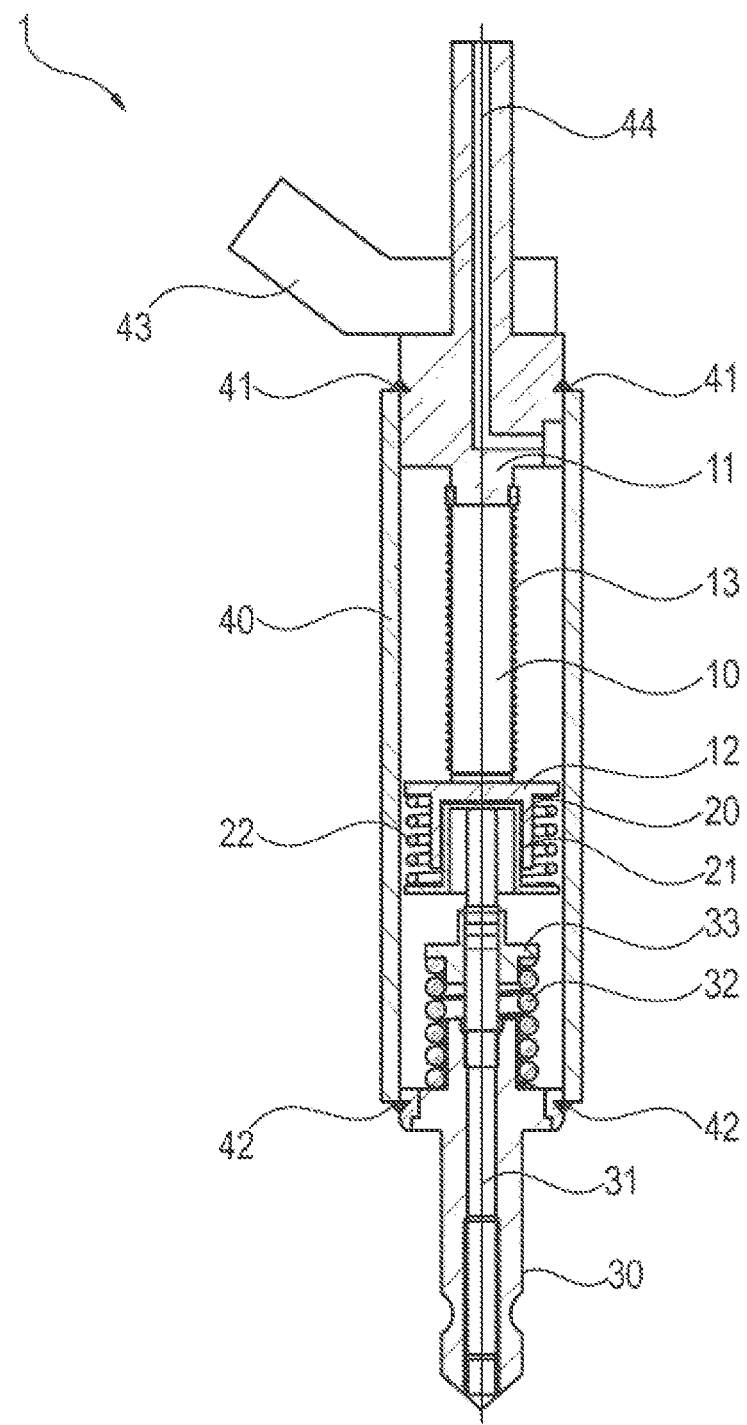
FIG. 1 is a schematic illustration of a cross section through a piezo injector according to teachings of the present disclosure.

The piezo injector 1 illustrated schematically in a cross section in FIG. 1 comprises a piezoelectric actuator 10, which may in particular have a piezo stack. The piezoelectric actuator 10 is advantageously arranged within a corrugated tube 13 which is welded to a head plate 11 and to a base plate 12 of the piezoelectric actuator 10. In this way, the piezoelectric actuator 10 is sealed off with respect to fuel by way of exclusively metallic seals. In particular, no seals composed of plastics, such as for example diaphragms composed of elastomers, are used. In this way, particularly robust and reliable sealing of the piezoelectric actuator 10 is achieved.

The corrugated tube 13 may be produced from a maraging steel. Maraging steels are advantageously of high-strength form, and have a high strength and good ductility. They comprise substantially carbon-free alloys, and are alloyed with a high fraction of nickel, for example greater than 12%. They may also comprise other alloy elements, for example aluminum, molybdenum, copper, niobium, cobalt and/or titanium.

Figure 2:
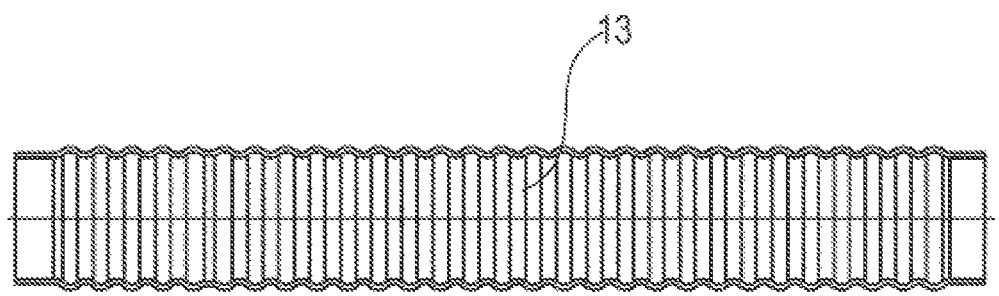
FIG. 2 shows an exterior view of the corrugated tube according to teachings of the present disclosure.
Figure 3:
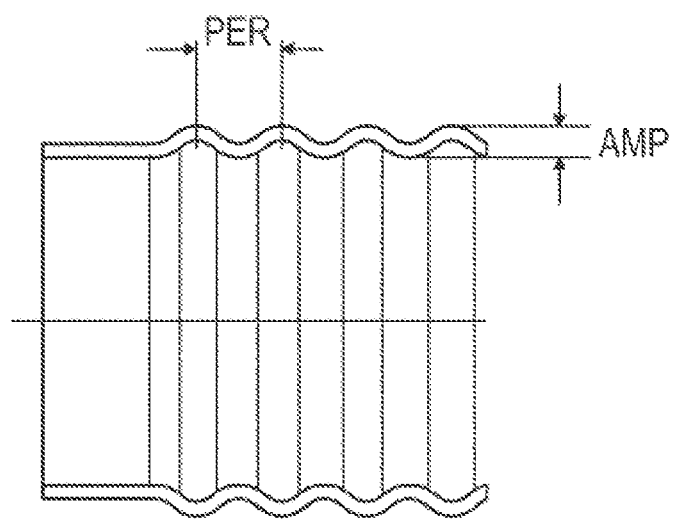
FIG. 3 is an enlarged illustration of a sub-region of the corrugated tube illustrated in FIG. 2.

The corrugated tube 13 is illustrated in FIG. 2 in an exterior view and in FIG. 3 in an enlarged detail view. The shaping of the corrugations of the corrugated tube 13 is selected such that a desired spring constant is obtained, without the admissible stresses being exceeded in order to achieve a predefined strength throughout the service life. Available design parameters for the corrugated tube 13 are in particular the wall thickness, the period PER and the amplitude AMP of the corrugations. For example, an outer diameter of the corrugated tube 13 of 9.2 mm, a wall thickness of 0.2 mm, a corrugation amplitude AMP of 0.4 mm and a corrugation period PER of 2 mm give rise to a spring constant of 1.8 N/mm and a possible preload force of 800 N in the case of a length of the corrugated tube 13 of 63 mm.

To obtain a predefined preload, for example of approximately 800 N, the corrugated tube 13 is fixed between the head plate 11 and the base plate 12 such that the piezoelectric actuator 10 is braced with a predefined preload between the head plate 11 and the base plate 12. The fixing of the head plate 11 and of the base plate 12 can be realized for example by way of welding, in particular laser welding. The corrugated tube 13 is in particular connected to the head plate 11 and to the base plate 12 such that the piezoelectric actuator 10 is sealed off in hermetically sealed fashion with respect to the surroundings.

The head plate 11 may provide a feed of electrical connections from an electrical plug connector 43 to the piezoelectric actuator 10. Furthermore, the head plate 11 may comprise a fuel supply 44 for the supply of highly pressurized fuel.

The transmission of forces from the piezoelectric actuator 10 to a nozzle needle 31 is realized by way of a hydraulic coupler, which comprises a coupler cylinder 20, a coupler piston 21 and a coupler spring 22. The coupler spring 20 is advantageously formed in the base plate 12 of the piezoelectric actuator 10. The base plate 12 and the coupler cylinder 20 may thus be formed from a single piece of metal. The coupler piston 21 is inserted into the coupler cylinder 20 with a suitable fit clearance, wherein the fit clearance is preferably selected to be in a range from 2 µm to 6 µm in order to achieve suitable dynamic transmission characteristics of the hydraulic coupler.

The coupler piston 21 may be of hollow-bored form in order to reduce the moving mass. The coupler piston 21 is forced against a face side of the nozzle needle 31 by way of a coupler spring 22. In this way, an absence of clearances in the drive is ensured. In the exemplary embodiment of FIG. 1, the coupler spring 22 is arranged between the coupler cylinder 20 and the injector body 40 which forms the outer casing of the piezo injector 1. It would alternatively also be possible for the coupler spring 22 to be arranged in the interior of the coupler piston 21, in particular in the intermediate space between the coupler piston 21 and that shell surface of the nozzle needle 31 which faces toward the coupler piston 21.

A thin fuel layer (not illustrated) may be situated in the hydraulic coupler between a face side, facing toward the base plate 12, of the coupler piston 21 and the base plate 12, which is simultaneously formed as coupler cylinder 20. The thickness of said thin fuel layer is selected to be as small as possible in order to achieve the greatest possible stiffness of the coupler. A minimal thickness of said thin fuel layer is determined by the required assembly tolerances and the differences in length expansion between the piezoelectric actuator 10 and the injector body 40 in the event of temperature changes owing to their different coefficients of thermal expansion. The layer thickness of the fuel layer may lie in a range from 0.05 mm to 0.3 mm.

The nozzle needle 31 of the piezo injector 1 is an outwardly opening nozzle needle which is guided in a nozzle body 30. The needle seat of the nozzle needle 31 may for example be in the form of a conical shell surface which, in the nozzle body 30, is forced against a hollow conical surface in order to realize the sealing function. A sealing force which acts on the nozzle needle 31 is generated by a nozzle spring 32 which is braced between the nozzle body 30 and a spring plate 33 which is connected to the nozzle needle 31. The spring plate 33 may in particular be pressed onto the nozzle needle 31.

The spring force of the nozzle spring 32 may be set such that a resultant force composed of the nozzle spring force minus the hydraulically acting needle opening force and minus a contact force of the hydraulic coupler in the presence of the maximum admissible injection pressure (rail pressure) still ensures an adequate needle seat force. The hydraulically acting needle opening force can be calculated from the cross-sectional area of the needle seat and the injection pressure, and the contact force of the hydraulic coupler corresponds to the spring force of the coupler spring 22. The resultant needle seat force is advantageously set to be in the range from 20 N to 50 N in the presence of the maximum admissible injection pressure.

The injector body 40 of the piezo injector 1 regionally forms an outer casing of the piezo injector 1, and may in particular be manufactured from steel. The injector body 40 is preferably formed in one piece, in particular from one tube piece. The injector body 40 may in particular be welded at one side, by way of a weld seam 41, to the head plate 11 of the piezoelectric actuator 10, and at the opposite side, by way of a weld seam 42, to the nozzle body 30. During the process of assembly of the injector body 40, the layer thickness of the thin fuel layer in the coupler piston 21 can be set.

The piezo injector 1 constructed in this way is characterized in particular in that it is relatively easy to produce and is highly robust.

The invention is not restricted by the description based on the exemplary embodiments. Rather, the invention encompasses every novel feature and every combination of features, which in particular includes every combination of features in the patent claims, even if said feature or said combination is itself not explicitly mentioned in the patent claims or exemplary embodiments.

What is claimed is:

1. A piezo injector for direct fuel injection, the piezo injector comprising:
    an injector body,
    an actuator unit having a piezoelectric actuator with a head plate and a base plate,
    wherein the piezoelectric actuator is surrounded by a corrugated tube braced between the head plate and the base plate such that the piezoelectric actuator has a preload imparted to it,
    a hydraulic coupler having a coupler piston, a coupler cylinder, and a coupler spring, and
    a nozzle unit having a nozzle needle arranged in a nozzle body,
    wherein the coupler cylinder is formed in the base plate of the piezoelectric actuator,
    wherein the coupler spring forces the coupler piston against a face side, facing toward the coupler piston, of the nozzle needle.

2. The piezo injector as claimed in claim 1, wherein the corrugated tube comprises a maraging steel.

3. The piezo injector as claimed in claim 1, wherein the piezo injector does not comprise any sealing material composed of a plastic.

4. The piezo injector as claimed in claim 1, wherein the injector body is a unipartite tube piece fixedly connected at one side to the head plate and at an opposite side to the nozzle body.

5. The piezo injector as claimed in claim 1, wherein the nozzle needle opens outwardly.

6. The piezo injector as claimed in claim 1,
wherein the nozzle unit has a nozzle spring for generating a closing force which acts on the nozzle needle.

7. The piezo injector as claimed in claim 6,
wherein the nozzle spring, at one side, is fastened to the nozzle body and, at the other side, presses against a spring plate which is attached to the nozzle needle.

8. The piezo injector as claimed in claim 1,
wherein a fuel film is arranged in the hydraulic coupler.

9. The piezo injector as claimed in claim 8,
wherein the fuel film has a thickness in the range from 0.05 mm to 0.3 mm.

10. An internal combustion engine comprising:
at least one combustion chamber
one or more piezo injectors for direct fuel injection into the at least one combustion chamber, each piezo injector comprising:
an injector body,
an actuator unit having a piezoelectric actuator with a head plate and a base plate,
a hydraulic coupler having a coupler piston, a coupler cylinder, and a coupler spring, and
a nozzle unit having a nozzle needle arranged in a nozzle body,
wherein the coupler cylinder is formed in the base plate of the piezoelectric actuator,
wherein the piezoelectric actuator is surrounded by a corrugated tube braced between the head plate and the base plate such that the piezoelectric actuator has a preload imparted to it,
wherein the coupler spring forces the coupler piston against a face side, facing toward the coupler piston, of the nozzle needle.

11. The internal combustion engine as claimed in claim 10, wherein the corrugated tube comprises a maraging steel.

12. The internal combustion engine as claimed in claim 10, wherein the piezo injector does not comprise any sealing material composed of a plastic.

13. The internal combustion engine as claimed in claim 10, wherein the injector body is a unipartite tube piece fixedly connected at one side to the head plate and at an opposite side to the nozzle body.

14. The internal combustion engine as claimed in claim 10, wherein the nozzle needle opens outwardly.

15. The internal combustion engine as claimed in claim 10, wherein the nozzle unit has a nozzle spring for generating a closing force which acts on the nozzle needle.

16. The internal combustion engine as claimed in claim 15, wherein the nozzle spring, at one side, is fastened to the nozzle body and, at the other side, presses against a spring plate which is attached to the nozzle needle.

17. The internal combustion engine as claimed in claim 10, wherein a fuel film is arranged in the hydraulic coupler.

18. The internal combustion engine as claimed in claim 17, wherein the fuel film has a thickness in the range from 0.05 mm to 0.3 mm.

* * * * *